United States Patent [19]

Moniwa et al.

[11] Patent Number: 4,692,994

[45] Date of Patent: Sep. 15, 1987

[54] PROCESS FOR MANUFACTURING SEMICONDUCTOR DEVICES CONTAINING MICROBRIDGES

[75] Inventors: Masahiro Moniwa, Kokubunji; Terunori Warabisako; Hideo Sunami, both of Nishitama, all of Japan

[73] Assignee: Hitachi, Ltd., Tokyo, Japan

[21] Appl. No.: 857,200

[22] Filed: Apr. 29, 1986

[51] Int. Cl.[4] .................................... H01L 21/425
[52] U.S. Cl. ........................ 437/40; 148/DIG. 150; 148/DIG. 164; 437/83; 437/97
[58] Field of Search ................ 29/571, 578, 576 J, 29/576 E, 576 B, 577 C; 148/187

[56] References Cited

U.S. PATENT DOCUMENTS

| | | | |
|---|---|---|---|
| 3,564,358 | 2/1971 | Hahnlein | 148/DIG. 164 |
| 3,793,721 | 2/1974 | Wakefield et al. | 29/578 X |
| 4,467,518 | 8/1984 | Bansal et al. | 148/187 X |
| 4,489,478 | 12/1984 | Sakurai | 29/577 C X |
| 4,498,226 | 2/1985 | Inoue | 148/187 X |
| 4,502,202 | 3/1985 | Malhi | 29/571 |
| 4,555,843 | 12/1985 | Malhi | 29/571 |
| 4,603,468 | 8/1986 | Lam | 29/576 J |
| 4,649,627 | 3/1987 | Abernathy et al. | 29/576 E |

Primary Examiner—George T. Ozaki
Attorney, Agent, or Firm—Antonelli, Terry & Wands

[57] ABSTRACT

A process for manufacturing semiconductor devices, comprising steps for obtaining a multilayered structure consisting of semiconductors and insulating films, by forming a microbridge which consists of a semiconductor in the form of a connecting bar or a one-side supported bar, and by forming an insulating film by oxidizing the exposed surface of the microbridge. The semiconductor device manufactured by the process of the invention exhibits good interface properties between the insulating film and the semiconductor layer. The invention makes it possible to easily manufacture a variety of MOSFETs with the SOI structure, which exhibit excellent characteristics.

10 Claims, 40 Drawing Figures

4,692,994

PROCESS FOR MANUFACTURING SEMICONDUCTOR DEVICES CONTAINING MICROBRIDGES

BACKGROUND OF THE INVENTION

The present invention relates to a process for manufacturing semiconductor devices, and particularly to a process for manufacturing semiconductor devices capable of forming an SOI structure in which the laminate structure between a semiconductor and an insulator has good interface properties to such an extent that it can be used as a channel region and a gate insulating film in MOSFET's for LSI's.

Electronic computers and communication equipment have been developed rapidly. In recent years, in particular, a plurality of computers are coupled through communication circuits to form a network in an attempt to realize high degree of functions, opening the door toward the age of information. Therefore, it is urged to develop these equipment to meet the needs of the times, and it is desired to provide large-scale integrated circuits (LSI's) which are fundamental parts and which operate at higher speeds maintaining higher degree of integration. The conventional method to meet this demand was chiefly to scale down the elements. In the future, however, it is considered that the three dimensional integrated circuits and new device concept and/or designs employing the SOI (silicon on insulator) structure will play a leading role. Examples of such devices are shown in FIGS. 8A and 8B.

FIG. 8A is a section view of a three dimensional integrated circuit, and FIG. 8B is a section view showing a one-gate-wide CMOS inverter which is a transistor of a new structure reported in a paper entitled "One-Gate-Wide CMOS Inverter on Laser-Recrystallized Polysilicon" disclosed in IEEE Electron Devices Letters, Vol. EDL-1, No. 6, June, 1980, pp. 117-118 by J.F. Gibbons and K.F. Lee. In either device, a MOS-type field effect transistor (MOSFET) formed in a silicon layer 6 on an insulating film 5 works as a fundamental element. In FIG. 8A, a portion surrounded by a dot-dash line represents a MOSFET. Here, the one-gate-wide CMOS inverter stands for a complementary MOSFET (CMOS) in which the two upper and lower MOSFET's share a single gate electrode 1 as schematically shown in FIG. 9.

The conventional technique for forming the SOI structure can be roughly divided into a method of forming single crystalline silicon on an insulating film or on an insulating substrate, and a method of forming an insulating layer in a single crystalline silicon substrate. An example of the former method includes a technique according to which polycrystalline silicon deposited on an insulating film such as $SiO_2$ is crystallized by laser annealing, electron beam annealing or strip heater annealing. An example of the latter method includes a technique according to which a damaged layer is formed in the substrate by hydrogen ion implantation, and the damaged layer that can be easily oxidized is selectively oxidized, or a technique which forms an $SiO_2$ layer in the silicon substrate by oxygen ion implantation. Owing to such technique, at present, it is made possible to form an SOI of good crystallinity which is capable of forming a MOSFET. However, none of the SOI structures formed by these methods exhibit good electric properties on the interface between the silicon layer 6 and the insulating layer 5. If the MOSFET is formed as shown in FIG. 8A, the interface 32 between the insulating film 5 and the silicon layer 6 formed thereon serves as a path for a leakage current across the source 2 and the drain 3, and the element exhibits quite poor performance.

To avoid this problem, therefore, a method was contrived to form a channel stopper by implanting impurity ions into the interface 32, presenting considerably improved results.

However, when an underlying insulating film 5 is to be used as a gate insulating film 4 which is as thin as 5 to 100 nm as in a MOSFET formed in the upper layer of the one-gate-wide CMOS inverter shown in FIG. 8B, a channel is formed in the interface 33 between the underlying insulating film 5 and the silicon layer 6 formed thereon. Therefore, the above-mentioned problem becomes so serious that none of the above-mentioned methods is effective; i.e., the problem remains unsolved.

In FIGS. 8A, 8B and 9, reference numeral 1 denotes a gate electrode, 2 denotes a source region, 3 denotes a drain region, 4 denotes a gate insulating film, 5 denotes an underlying insulating film, 6 denotes a silicon layer, 7 denotes a silicon substrate, and 32 and 33 denote interfaces between the underlying insulating film and the silicon layer.

SUMMARY OF THE INVENTION

The object of the present invention is to provide a process for manufacturing semiconductor devices having an SOI structure which exhibits good interface properties between the insulating film and the semiconductor layer to such an extent that the underlying insulating film can be utilized as a gate insulating film, eliminating the defects involved in the above-mentioned conventional art.

To achieve the above object according to the present invention, the process for manufacturing semiconductor devices comprises a step for forming a bridge-type connecting bar or one-side supported bar (hereinafter referred to as microbridge) using a semiconductor as a material, and a step for forming an insulating film in at least a portion of the upper layer or the lower layer of the microbridge by oxidation or nitridation, to thereby form a multilayered structure consisting of a semiconductor and an insulator.

Further, the process for manufacturing semiconductor devices according to the present invention comprises:

(i) a step for forming at least one first insulating film of a predetermined shape on a substrate;

(ii) a step for forming a continuous semiconductor film on said substrate and said first insulating film;

(iii) a step for forming at least one island region of a predetermined shape by a lithography, said island region being comprised of the continuous semiconductor film on said substrate and on said first insulating film and said first insulating film under said semiconductor film;

(iv) a step for forming a microbridge which consists of said semiconductor film by removing said first insulating film of said island region from at least the side of said semiconductor film; and (v) a step for forming a second insulating film on the exposed surface of said microbridge.

When the MOSFET's are to be produced by the process for manufacturing semiconductor devices of the present invention, a step (vi) for forming, in said microbridge, a MOSFET with said second insulating film as a gate insulating film, may be added after the aforementioned step (v).

The substrate may be the one that is usually used for the semiconductor devices. Though there is no particular limitation, a semiconductor substrate should be used when an active element such as MOSFET is to be formed in the substrate.

The second insulating film formed in the above step (v) may be an oxide film that is formed by an oxide-forming step such as thermal oxidation or plasma oxidation, or may be a nitride film formed by a nitride-forming step such as nitriding.

After the step (v), another step for providing the first insulating film on said microbridge, and the above-mentioned steps (ii) to (vi) may further be repeated at least one time, in order to form a multilayered microbridge.

When a semiconductor substrate is used, furthermore, the MOSFET's can be formed on both the substrate and the microbridge by the process for manufacturing semiconductor devices, which comprises:

(i) a step for forming at least one first insulating film of a predetermined shape on a semiconductor substrate;

(ii) a step for forming a continuous semiconductor film on said semiconductor substrate and said first insulating film;

(iii) a step for forming at least one island region of a predetermined shape by a lithography, said island region being comprised of the continuous semiconductor film on said semiconductor substrate and on said first insulating film and said first insulating film under said semiconductor film;

(iv) a step for forming a source region and a drain region in said semiconductor substrate and in said semiconductor film, respectively, by ion implantation;

(v) a step for forming a microbridge by removing the first insulating film from the island region, and for forming a second insulating film on the exposed surface of said microbridge; and (vi) a step for forming a gate electrode in a gap under said microbridge.

In this case, the MOSFET's are self-aligned with respect to each other. In this case, furthermore, a one-gate-wide CMOS inverter structure can be formed by adding, after the step (vi), a step (vii) for removing a portion of said microbridge that is contacted to the source region of said semiconductor substrate.

In either case, the semiconductor constituting the microbridge should be a single crystalline semiconductor from the standpoint of forming elements. Single crystalline silicon is generally used.

The size of the microbridge should be determined depending upon the element that is to be formed in the microbridge. When a MOS is to be formed, the size is determined with reference to MOS's in general. Though there is no particular limitation, the height of the microbridge should desirably be smaller than 10 μm when the gate electrode is to be formed in the gap under the microbridge. If this height is exceeded, it becomes difficult to deposit the gate electrode.

Silicon and oxygen exhibit good chemical interaction relative to each other, and an $SiO_2$ layer/silicon layer structure which exhibits very good interface properties is formed owing to the chemical reaction between them, i.e., owing to the oxidation of a mechanism in which oxygen diffuses and enters into the substrate to meet silicon, to thereby form a silicon-oxygen bond. In other words, (1) a solid silicon without damage is oxidized to form an $SiO_2$ film, and (2) at this moment, oxygen is supplied by diffusion. The above two points serve as requirements for forming an $Si/SiO_2$ system that exhibits good interface properties. If the conventional SOI technology is considered from such a point of view, the method having the process for forming the silicon layer on the insulating film is not satisfying the above requirement (1), and in the method having the process for forming a $SiO_2$ layer inside the Si substrate, the requirement (2) is not satisfied, either, since the $SiO_2$ layer is formed in the silicon substrate by introducing oxygen by the ion implantation. It is therefore difficult to form a good interface.

Based upon the consideration on silicon, the present invention was contrived in an attempt to satisfy the above-mentioned requirements (1) and (2).

DESCRIPTION OF THE PREFERRED EMBODIMENTS

Embodiments of the invention will be described hereinbelow.

Embodiment 1

This embodiment deals with the case where MOSFET's are formed in a silicon layer on an insulator.

Figure 1A:
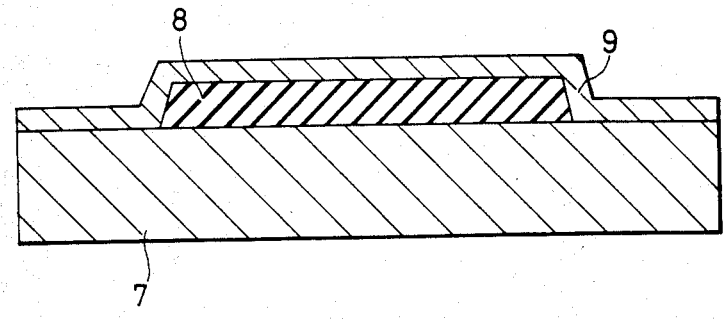
Figs. 1A to 1E are section views and perspective views illustrating the steps according to a first embodiment of the present invention.
Figure 1B:
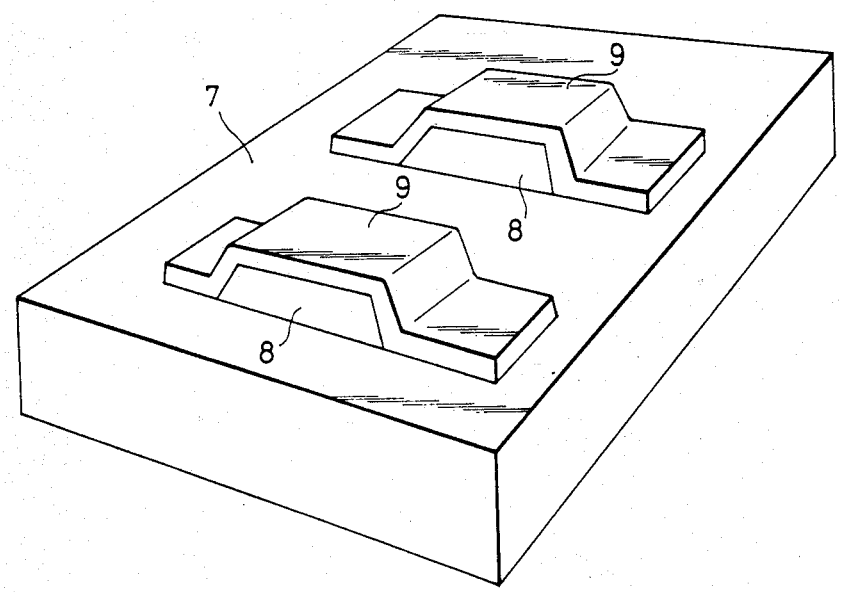
Figure 1C:
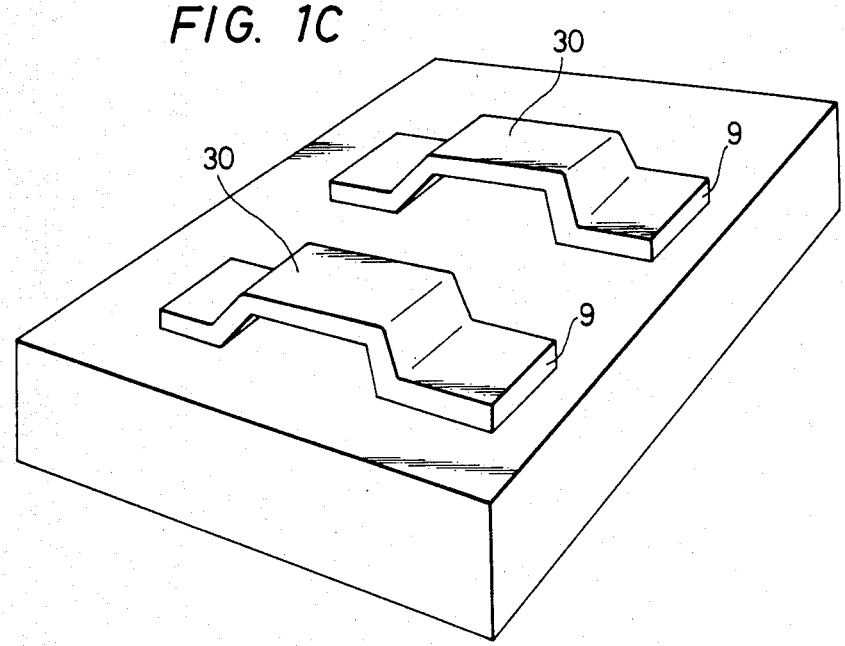
Figure 1D:
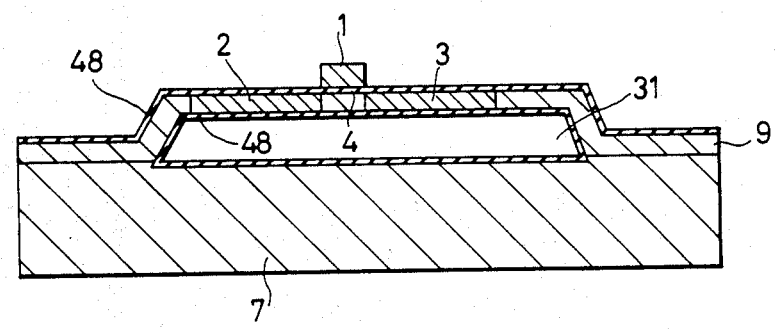

As shown in FIG. 1A, an $SiO_2$ film 8 is formed maintaining a thickness of 7000 Angstroms by the CVD (chemical vapor deposition) method on a single crystalline silicon substrate 7, and is isolated in the form of an oblong island by the ordinary photolithography technique. Here, an insulating film composed of $Si_3N_4$ or the like may be formed instead of forming the $SiO_2$ film. Or, the insulating film may be composed of a material other than $SiO_2$ or $Si_3N_4$, provided it exhibits a markedly large etching rate compared with that of a semiconductor film deposited thereon. Further, the island may be formed in any other shape such as circular shape, square shape, oblong shape, or the like. A polycrystalline silicon film is deposited thereon maintaining a thickness of 3500 Angstroms by the CVD method, and is transformed into a single crystalline form by the irradiation with a laser beam to form a single crystalline silicon film 9. That is, the SOI structure is formed by the conventional SOI-forming technique relying upon the laser annealing. Any other conventional SOI-forming technique may be employed such as SOI-forming technique based upon the strip heater annealing, SOI-forming technique which utilizes the solid phase epitaxial growth of silicon, or the like technique. In this embodiment, the whole semiconductor film is transformed into a single crystalline form. However, the semiconductor film may remain in a polycrystalline form if at least the element region is transformed into the single crystalline form. A photomask is applied thereon followed by anisotropic dry etching, in order to divide the SOI region into several island regions as shown in FIG. 1B (two islands are shown here). The $SiO_2$ film 8 is then selectively etched to form a microbridge 30 consisting of silicon as shown in FIG. 1C. The thermal oxidation is then effected in dry oxygen at 1000° C., so that the surface of the microbridge is covered with an $SiO_2$ film 48 which has good quality and which is 450 Angstrom's thick. Thereafter, a MOSFET is formed by a widely known method on the microbridge 30 to use the $SiO_2$ film 48 as a gate oxide 4. FIG. 1D is a section view thereof. Here, the plasma oxidation may be effected instead of the thermal oxidation, and the $SiO_2$ film may be replaced by any other insulating film such as $Si_3N_4$. Further, if a gap 31 under the microbridge 30 is filled with polycrystalline silicon by the combination of CVD and etching, there can be formed not only a gate electrode 1' of the upper layer but also a gate electrode 1' of the lower layer as shown in FIG. 1E.

Figure 1E:
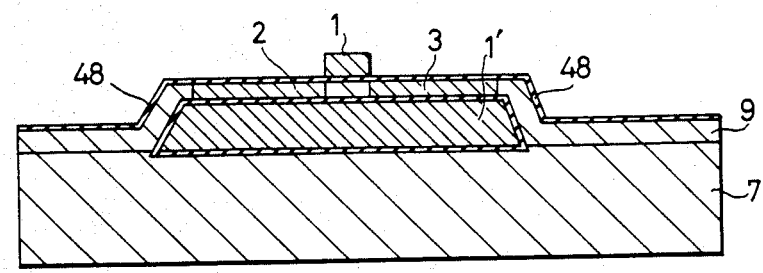

In FIGS. 1D and 1E, reference numerals 2 and 3 denote a source region and a drain region, respectively.

Embodiment 2

In this embodiment, a multilayered integrated circuit is prepared by forming a MOSFET on the silicon substrate, forming thereon a microbridge which consists of silicon, and forming a MOSFET on the bridge.

Figure 2A:
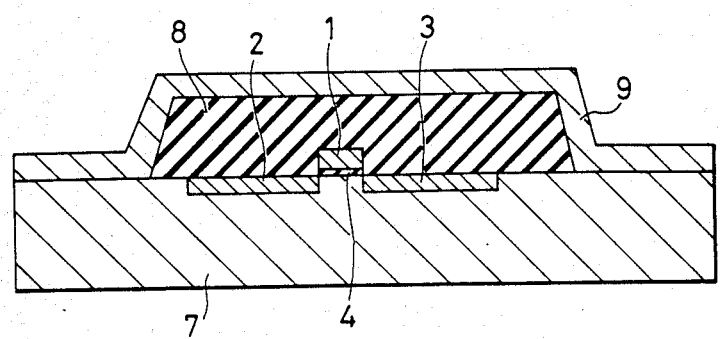
FIGS. 2A to 2E are section views and perspective views illustrating the steps according to a second embodiment of the present invention.
Figure 2B:
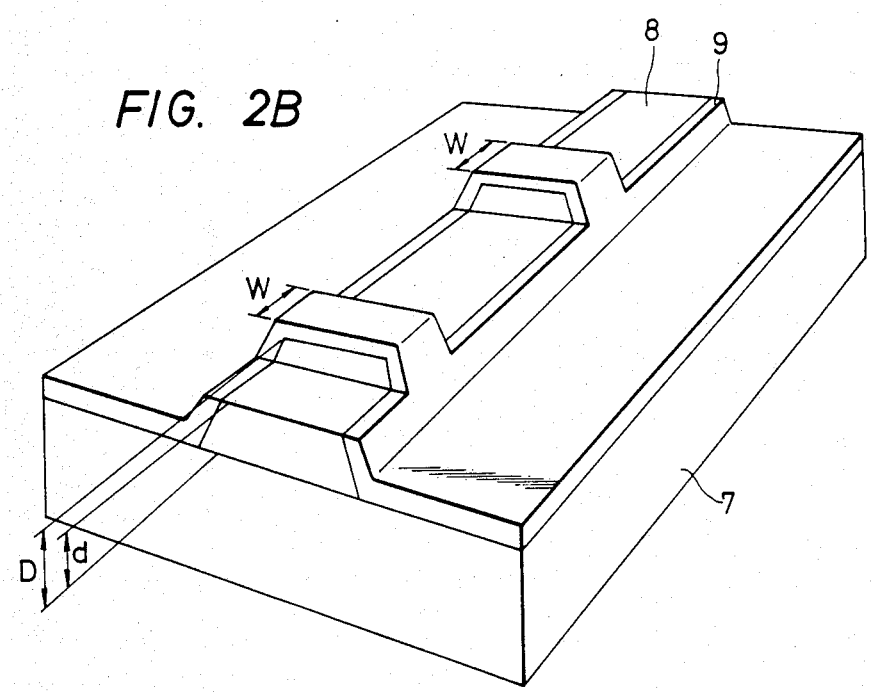
Figure 2C:
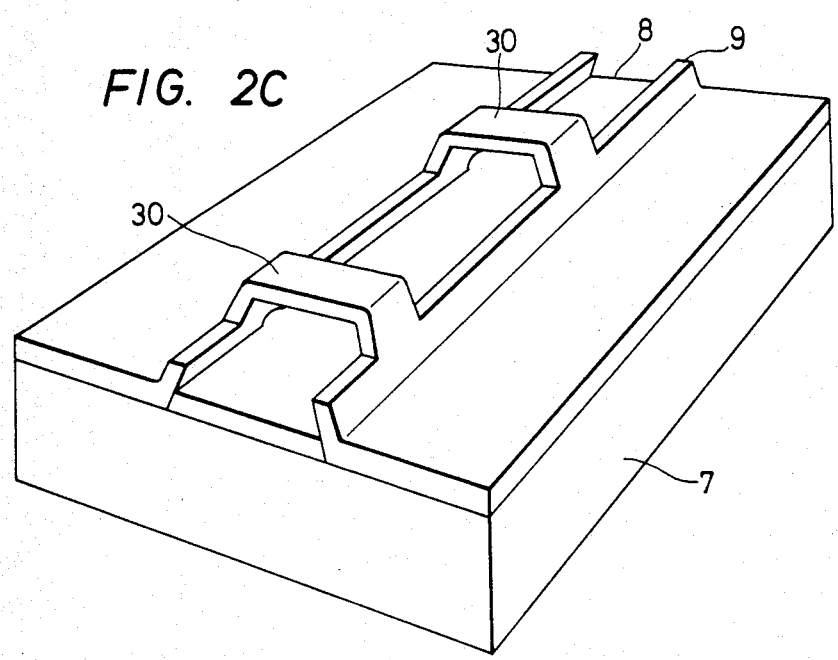
Figure 2D:
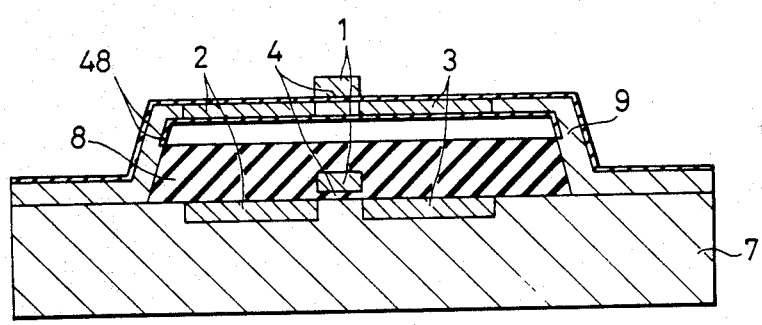

First, as shown in FIG. 2A, a MOSFET consisting of a gate electrode 1, a source region 2, a drain region 3 and a gate insulating film 4, is formed on a silicon substrate 7 by an ordinary process. An $SiO_2$ film 8 is deposited thereon by the CVD method maintaining a thickness of about 1.3 $\mu$m, and is patterned into an oblong shape by the known photolithography like in the embodiment 1. Then, the polycrystalline silicon film is deposited thereon maintaining a thickness of 3500 Angstroms by the CVD method, and is scanned by a laser beam, so that silicon deposited thereon is transformed into a single crystalline form, to thereby obtain a single crystalline silicon film 9. It needs not be pointed out that the SOI-forming technique using the electron beam, the SOI-forming technique utilizing the solid phase epitaxial growth, or the like technique may be employed in place of the SOI-forming technique which uses the laser beam. The oblong SOI region is cut off at predetermined portions by the etching using a mask to form island regions in a shape as shown in FIG. 2B. In this case, however, attention should be given such that a requirement d>W/2 is satisfied (see FIG. 2B where d denotes a thickness of the $SiO_2$ film 8 that remains on the region which is cut off, and W denotes a width of the SOI region which is not cut off). Concretely speaking, the width W is selected to be 0.8 $\mu$m and the thickness d is selected to be 0.8 $\mu$m. Then, the $SiO_2$ film 8 is etched by 0.5 $\mu$m by the widely known highly selective isotropic etching to remove part of the $SiO_2$ film 8 under the silicon film 9 in the SOI structure, to thereby form microbridge 30 consisting of silicon as shown in FIG. 2C. In this case, the depth by which the $SiO_2$ film 8 is etched has not been reaching the gate oxide of the MOSFET on the silicon substrate 7. Therefore, there is no probability that the FET is damaged. The requirement d>W/2 makes it possible to carry out the etching as mentioned above. Then, as shown in FIG. 2D, an $SiO_2$ film 48 is formed to have a thickness of 450 Angstroms by the thermal oxidation like in the embodiment 1. With the $SiO_2$ film 48 as a gate oxide 4, a MOSFET is formed on the microbridge through an ordinary process. The oxidation may be carried out by the plasma oxidation or by any other oxidation method like in the embodiment 1.

Thereafter the gap under the microbridge is filled with $SiO_2$ 8 by the low-pressure CVD method, and the whole surface of the substrate is covered with the $SiO_2$ film 28. Thereafter, though not diagrammed, through holes are formed and a wiring composed of aluminum is formed to complete a multilayered integrated circuit. In this embodiment, upper and lower semiconductor layers having different types of conduction are formed, the gates are electrically connected together, and the heavily impurity doped semiconductor region of MOSFET of the upper layer is electrically connected to the heavily impurity doped semiconductor region of MOSFET of the lower layer, to thereby form a CMOS inverter. It need not be pointed out that the heavily impurity doped semiconductor regions of the upper and lower layers may be connected without using the wiring, by so forming the impurity doped regions that they are directly superposed upon one another over the drain regions 3 as shown in FIG. 2E, in which the $SiO_2$ film 48 is not diagrammed.

Embodiment 3

Figure 2E:
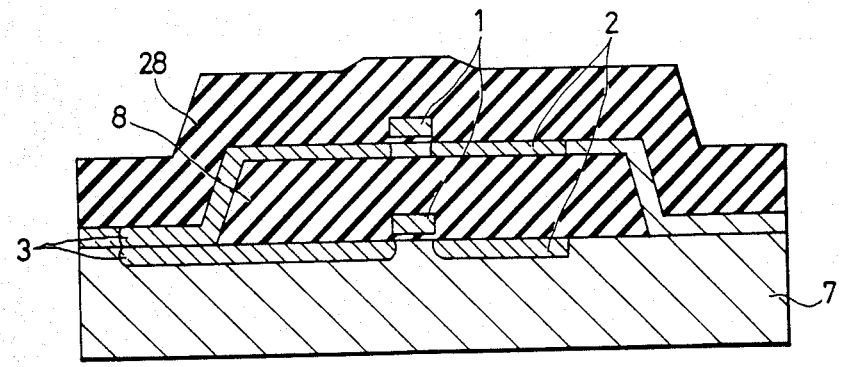
Figure 3A:
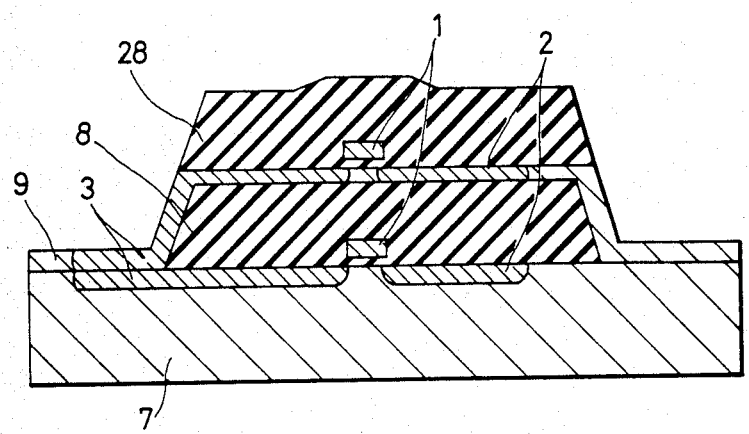
FIGS. 3A and 3B are section views illustrating the steps according to a third embodiment of the present invention.
Figure 3B:
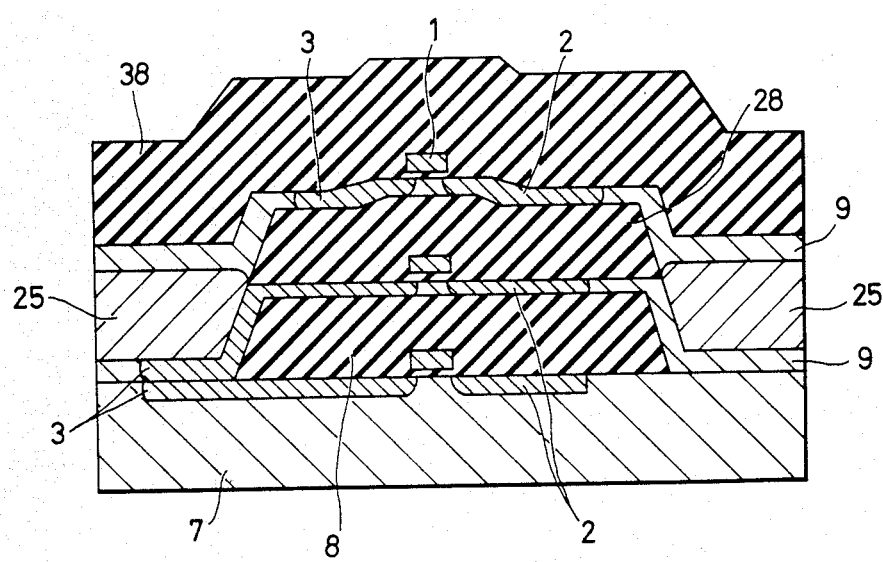

The structure shown in FIG. 2E is formed by the process of the embodiment 2. Then, using a photomask, the $SiO_2$ film 28 is removed by etching but leaving it on the microbridge only (FIG. 3A). Then, as shown in FIG. 3B, a single crystalline silicon film 25 is deposited only on the regions where silicon is exposed to a height of the microbridge by the well-known selective epitaxial growth method, and the surface is flattened. Nearly a flat structure can be obtained if the single crystalline silicon film is deposited to the height of the $SiO_2$ film 28. Thereafter, a microbridge is formed again by the process of the embodiment 2, and MOSFETs are formed in the layers to obtain the structure shown in FIG. 3B. Though not diagrammed, through holes are formed in an $SiO_2$ film 38 formed on the surface, and wirings are formed to complete a three-layered integrated circuit. In this embodiment, however, polycrystalline silicon having a high impurity concentration is used instead of forming aluminum wirings.

In FIGS. 3A and 3B, reference numerals other than 25 such as 3B denotes the same portions as those of FIGS. 2A to 2E, and the $SiO_2$ film 48 is not diagrammed.

Embodiment 4

This embodiment deals with the case where a one-gate-wide CMOS inverter is prepared according to the present invention. In both the upper and lower layers, the source and drain regions are formed being self-aligned to the gate electrode.

Figure 4A:
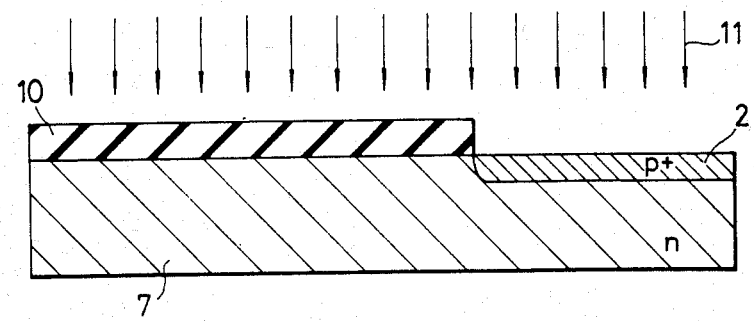
FIGS. 4A to 4O are section views and perspective views illustrating the steps according to a fourth embodiment of the present invention.
Figure 4B:
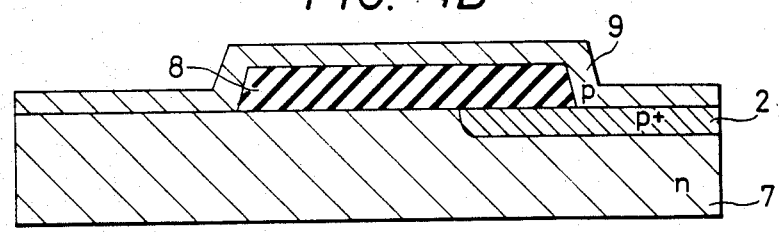
FIGS. 4P and 4Q are a section view and a perspective view illustrating the steps according to a fifth embodiment of the present invention.
Figure 4C:
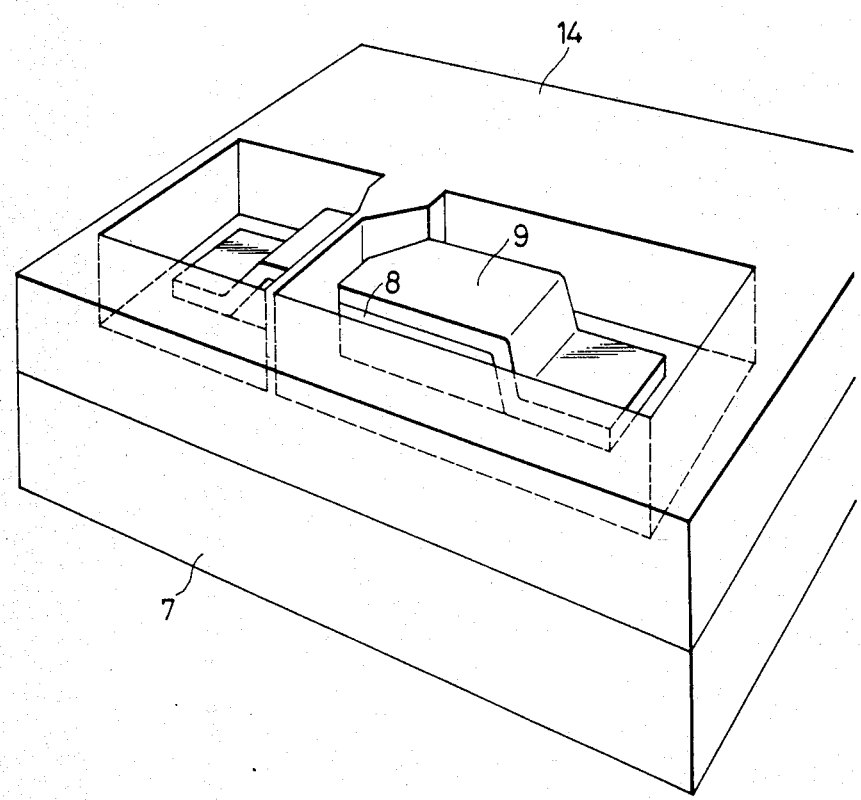
Figure 4D:
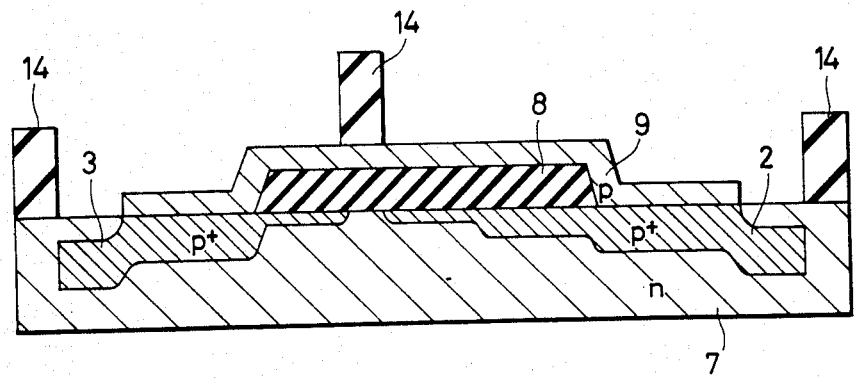
Figure 4E:
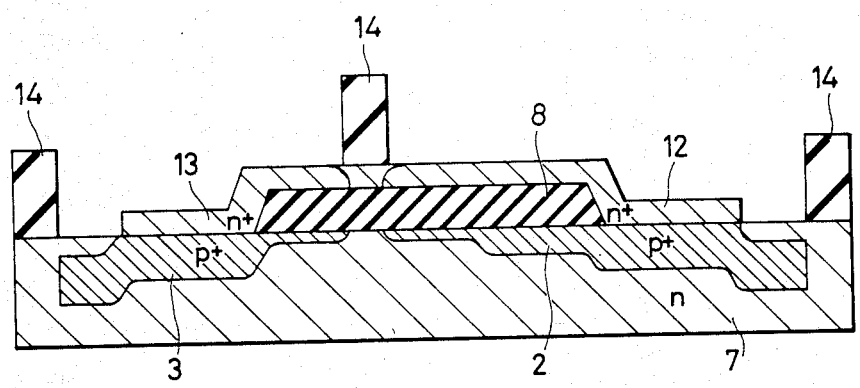
Figure 4F:
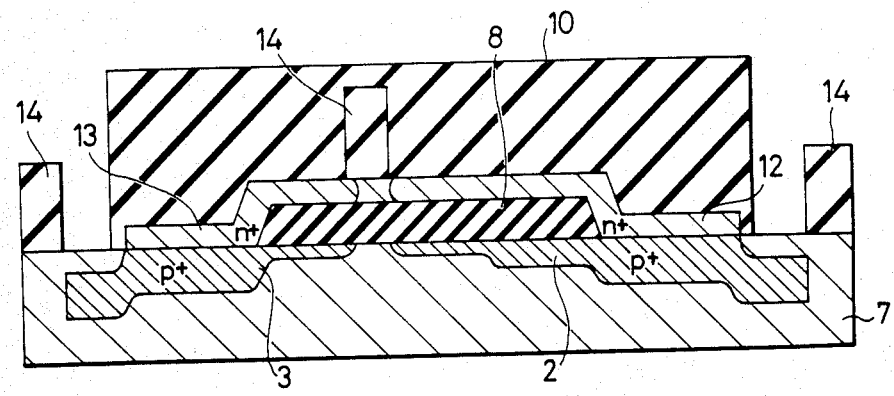
Figure 4G:
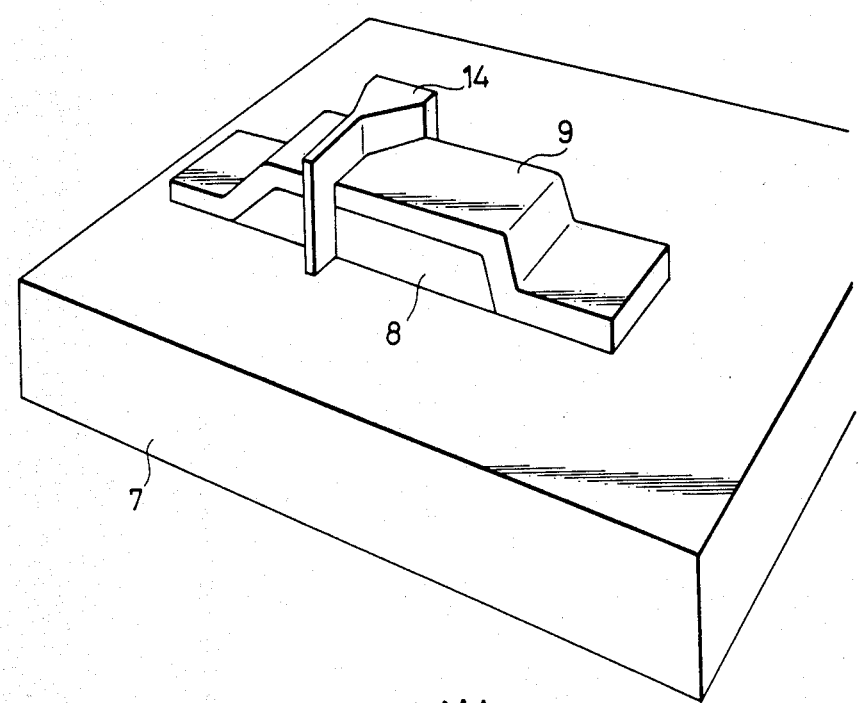
Figure 4H:
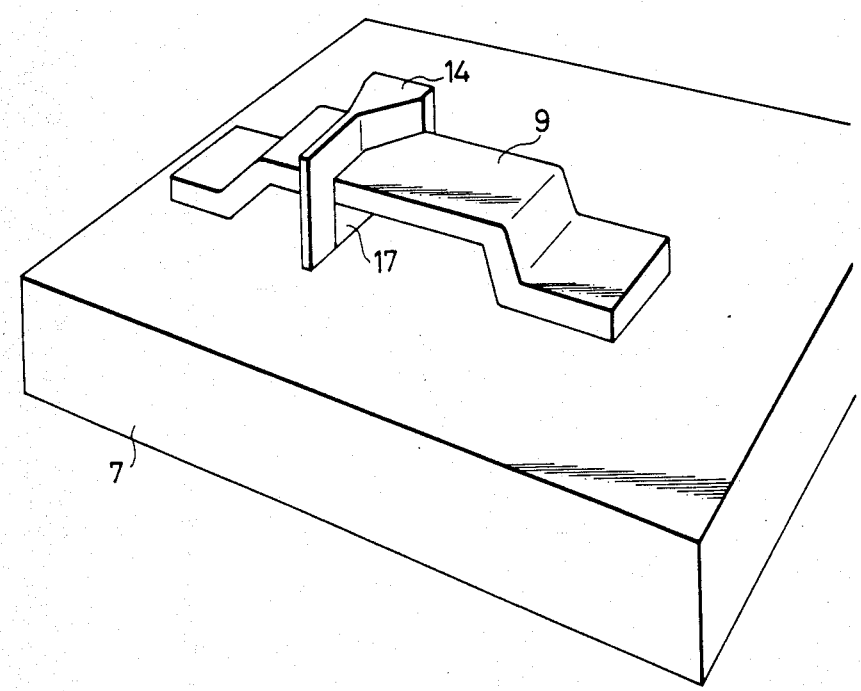
Figure 4I:
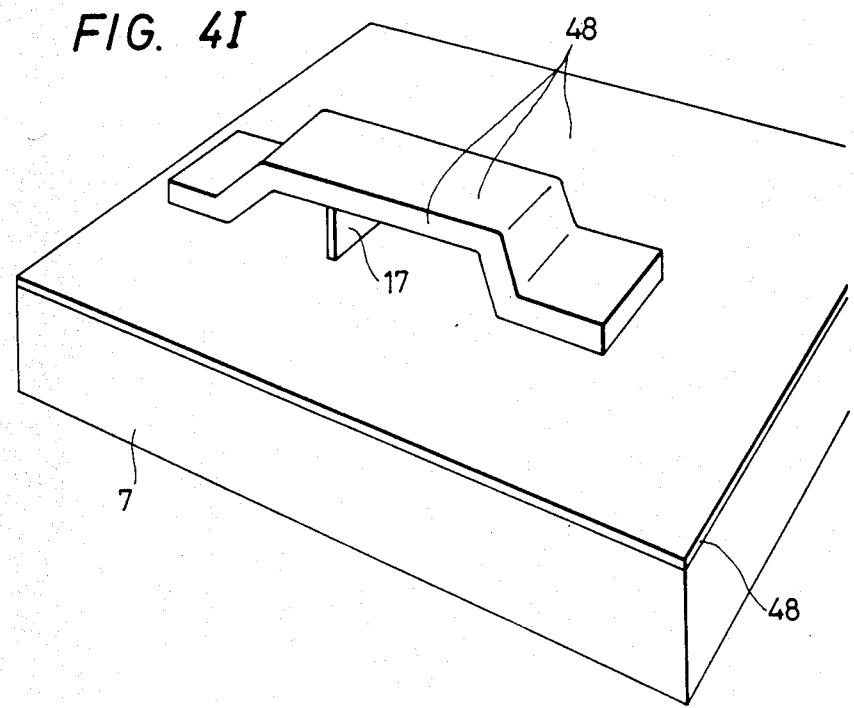
Figure 4J:
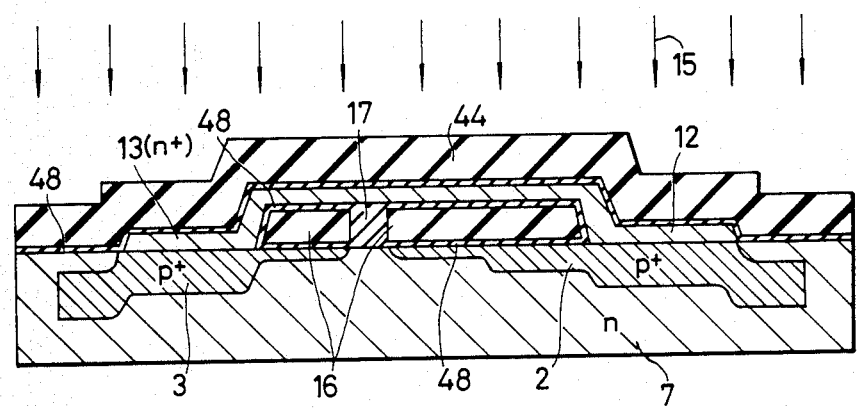
Figure 4K:
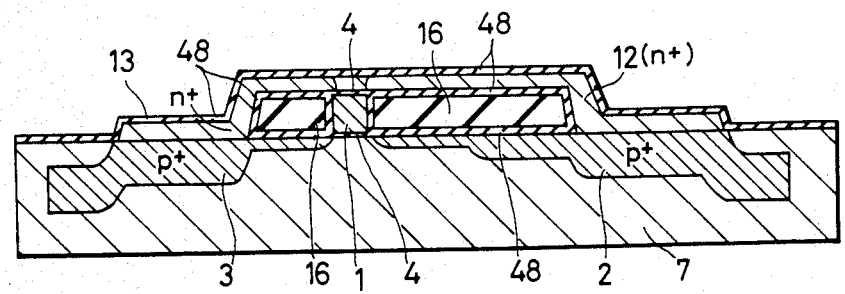

As shown in FIG. 4A, an n-type single crystalline silicon substrate 7 is prepared, and boron is implanted thereinto as designated at 11 using a mask 10 composed of a photoresist in order to form a p+-type region 2. This region finally serves as a source region of MOSFET of the lower layer. Then, as shown in FIG. 4B, the SOI structure is formed so as to be partly overlapped on the p+-type region by the conventional SOI-forming technique based upon the laser annealing as in the embodiment 1. Other SOI-forming technique may be employed like in the embodiment 1, as a matter of course. Boron ions are implanted into the single crystalline silicon film 9 that is deposited to impart the p-type of electric conduction. Reference numeral 8 denotes an SiO₂ film. Then, a mask is applied thereon, and the SOI region is divided by etching into several islands as shown in FIG. 1B of the first embodiment. Then, as Si₃N₄ film 14 is deposited by the CVD method on the surface of the substrate, and is etched through a mask to form a shape as shown in FIG. 4C (which shows only one island region). The Si₃N₄ film 14 is used as a mask for ion implantation to form the source and drain, and is further used to determine the position for forming the gate electrode. That is, boron ions are implanted with an acceleration energy of 500 keV and 200 keV to form p+-type regions 2 and 3 as shown in FIG. 4D. The p+-type region 2 superposed on the p+-type region that had been formed in the substrate in advance prior to forming the SOI structure, is used as the source region 2 of MOSFET of the lower layer in the one-gate-wide CMOS inverter, and another p+-type region is used as the drain region 3 of MOSFET of the lower layer. Then, phosphorus ions are implanted with an acceleration energy of 200 keV to form n+-type regions 12 and 13 in the deposited silicon film 9 as shown in FIG. 4E. The n+-type region 12 contacted to the source region 2 of the lower layer is used as a source region 12 of MOSFET formed in the upper layer, and the n+-type region 13 contacted to the drain region 3 of the lower layer is used as a drain 13 of the upper layer. With reference to FIG. 4F, a photoresist 10 is applied onto the surface of the substrate, and is patterned by the photolithography to form a mask as shown. The Si₃N₄ film is subjected to the selective etching and is removed from around the SOI islands. The resist 10 is then removed to obtain a shape as shown in FIG. 4G. Here, if a specimen is exposed in a plasma, the surface of the specimen is covered with a field region called sheath. In the sheath, the positive ions are accelerated toward the specimen. Therefore, if the plasma etching is effected in a region where the gas pressure is low enough that a mean free path of ions becomes greater than the thickness of the sheath, the etching proceeds only in a direction perpendicular to the surface of the object. The SiO₂ film 8 on the specimen is selectively etched by utilizing this property. Namely, as shown in FIG. 4H, the SiO₂ film 8 is removed except a portion concealed by the Si₃N₄ film 14, and whereby a microbridge composed of silicon is formed. The remaining SiO₂ film 8 forms a dummy gate 17. The Si₃N₄ film 14 is then selectively removed by etching. The surface of the specimen is covered with an SiO₂ film 48 of a thickness of 1000 Angstroms by thermal oxidation in the same manner as in the embodiment 1, as shown in FIG. 4I. With reference to FIG. 4J, the Si₃N₄ films 44, 16 are deposited by the CVD method followed by anisotropic etching as designated at 15. The Si₃N₄ film 44 is removed except the Si₃N₄ films 16 that are formed under the microbridge. The SiO₂ film is then selectively removed by etching so that the SiO₂ film 17 is removed from under the microbridge. The thermal oxidation is then effected in the same manner as described above in order to form an SiO₂ film maintaining a thickness of 250 Angstroms under the lower surface of the microbridge and on the surface of the substrate under the microbridge as shown in FIG. 4K. This SiO₂ film is a gate oxide 4 of the one-gate-wide CMOS inverter. Thereafter, a polycrystalline silicon film 1 having a high impurity concentration is deposited by the CVD method followed by anisotropic etching so as to be charged under the microbridge as shown in FIG. 4K, just like when the Si₃N₄ film 16 was charged under the microbridge and was anisotropically etched in the previous step shown in FIG. 4J. This polycrystalline silicon film 1 forms a gate electrode 1 of the one-gate-wide CMOS inverter. Major portions of the devices are thus completed through the above-mentioned procedure.

Figure 4L:
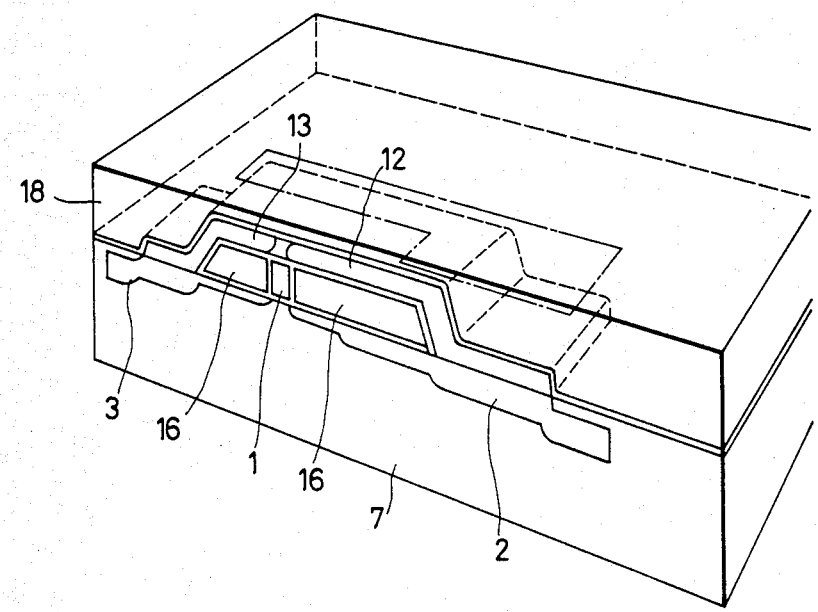
Figure 4M:
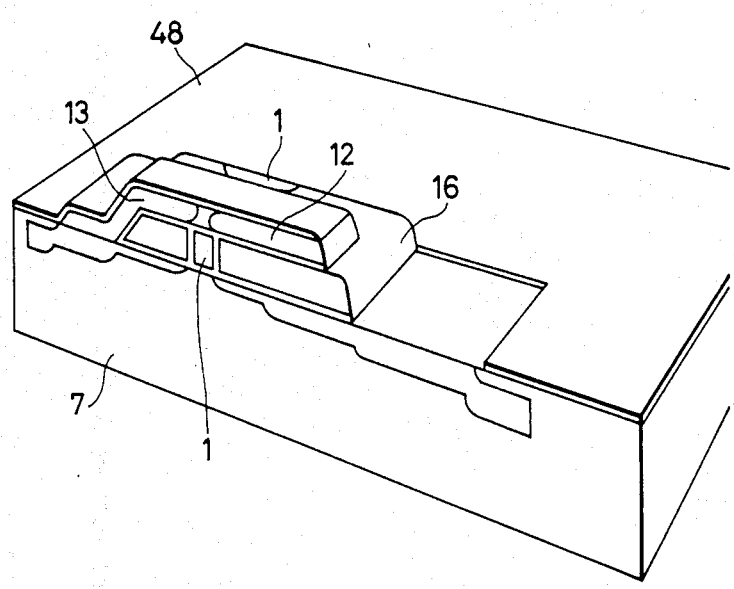
Figure 4N:
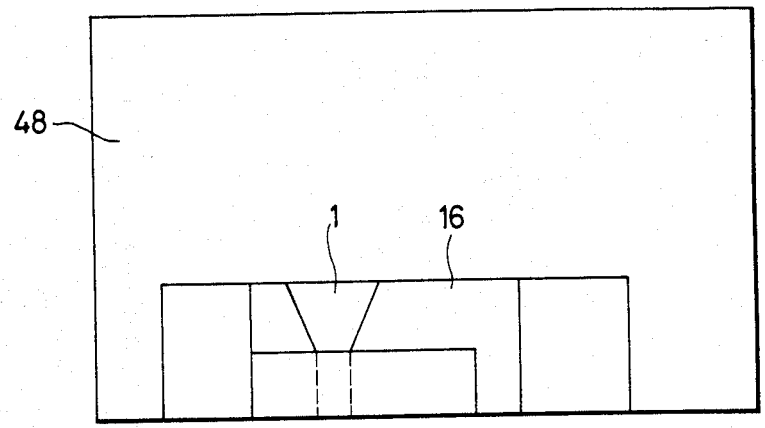

Then, the processing is effected to achieve electric connection to the gate 1, and to the sources 12, 2 of the upper and lower layers. First, as shown in FIG. 4L, a photoresist 18 is applied onto the surface of the specimen. The photoresist film is then removed from the region surrounded by a dot-dash line in FIG. 4L, and the surface of the specimen is subjected to the etching until the gate electrode buried under the microbridge is exposed. The resist 18 is then removed so that the specimen assumes the form as shown in FIGS. 4M and 4N. As will be understand from the top view of FIG. 4N, the gate electrode 1 is exposed in a trapezoidal shape. This is because, the mask 14 used for forming the dummy gate assumed such a shape as shown in FIG. 4H.

Figure 4O:
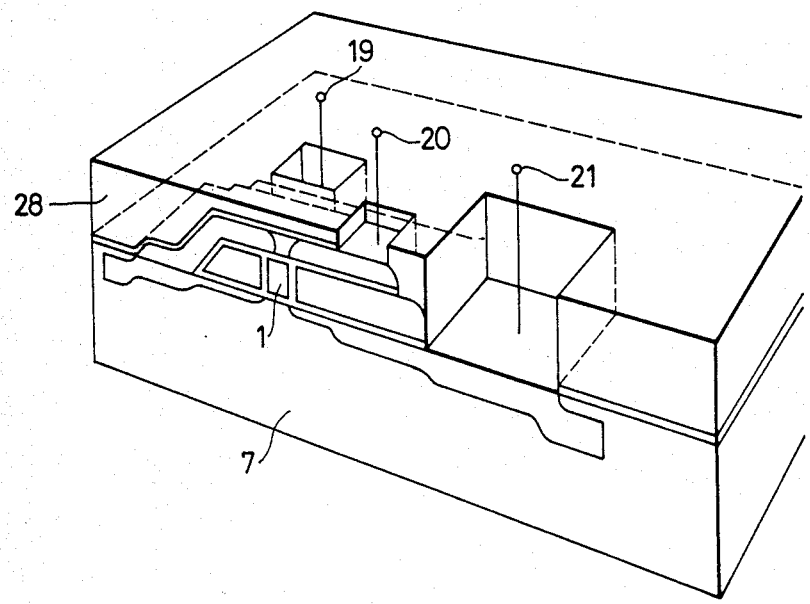

The contact resistance can be reduced since the wiring is formed on the region of the trapezoidal shape. However, when even a slightly large contact resistance of the gate is permissible, the gate electrode 1 need not necessarily assume the trapezoidal shape. Here, the mask for forming the dummy gate further serves as a mask for forming the source and drain by ion implantation. Therefore, the shape at the ends of source and drain matches the shape of the gate electrode, as a matter of course. Through this step, the gate electrode 1 is partly exposed, and the source 12 in MOSFET of the upper layer is isolated from the source 2 of MOSFET of the lower layer. Finally, as shown in FIG. 4O, an SiO₂ film 28 is deposited by bias sputtering, contact holes are formed by etching using a mask, and aluminum wiring is formed to complete the one-gate-wide CMOS inverter. Here, it needs not be pointed out that a similar one-gate-wide CMOS inverter can also be produced through the same process even when the types of electric conduction employed in the above embodiments are reversed.

In FIG. 4O, reference numeral 19 denotes a gate electrode terminal, 20 denotes a source terminal of MOSFET of the upper layer, and 21 denotes a source electrode terminal of MOSFET of the lower layer.

Embodiment 5

This embodiment is a simplified form of the embodiment 4. That is, when the stray capacitance between the source or drain and the gate must be reduced to a small value, the device of the embodiment 4 is required. When the stray capacitance does not present much of a problem, on the other hand, the device of this embodiment is desirable.

Figure 4P:
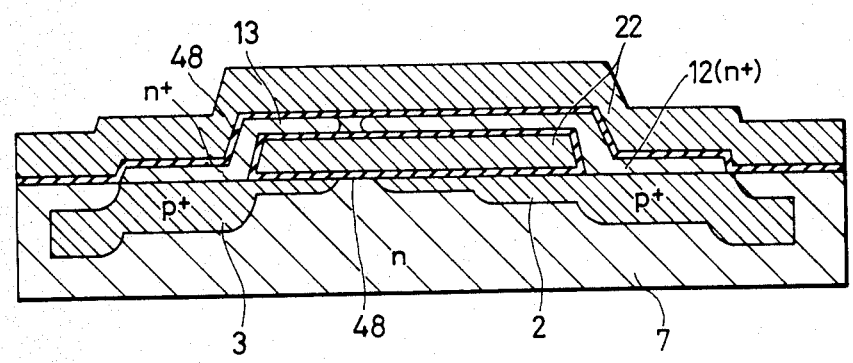
Figure 4Q:
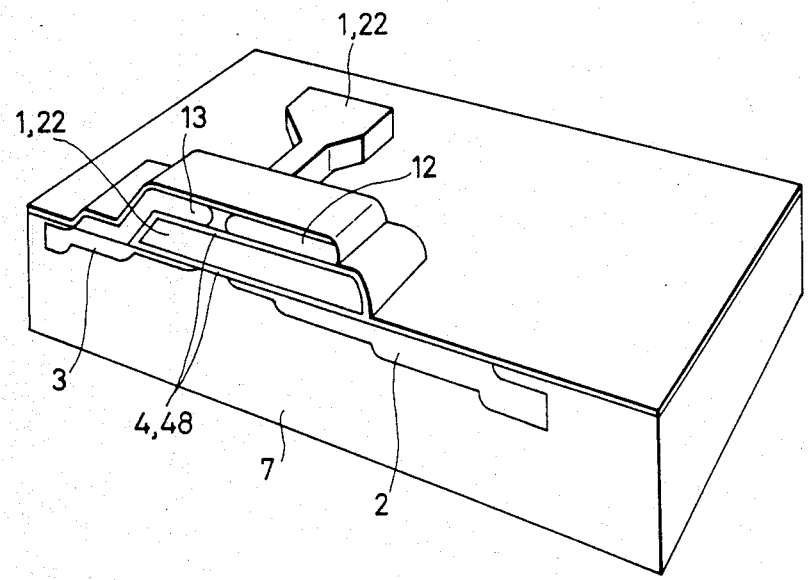

The structure shown in FIG. 4E is formed by the same procedure as the one explained in the embodiment 4. The $Si_3N_4$ film 14 is removed by the same selective etching method as that of the embodiment 4, and the $SiO_2$ film 8 is removed by another selective etching method. An $SiO_2$ film 48 is formed on the surface of the specimen maintaining a thickness of 250 Angstroms by the thermal oxidation. Then, polycrystalline silicon films 22 of a high impurity concentration are formed on the surface of the substrate, on the microbridge and under the microbridge by the low-pressure CVD method, in order to realize the structure shown in FIG. 4P (section view). Then, the polycrystalline silicon film 22 on the substrate is removed by the anisotropic etching except the portion on the microbridge and the portion that will be used as an electrode for drawing the gate electrode. Thereafter, the resist is applied, selectively removed, and the etching is effected using the resist as a mask, in the same manner as in the embodiment 4 shown in FIGS. 4L and 4M, in order to isolate the source 12 of MOSFET of the upper layer from the source 2 of MOSFET of the lower layer (FIG. 4Q). The specimen is then covered with a passivation film and contact holes are formed therein like the case of the $SiO_2$ film 28 shown in FIG. 4O of the embodiment 4. Then, wiring is formed to complete a one-gate-wide CMOS inverter. Even in this embodiment, it need not be pointed out that the one-gate-wide CMOS inverter can be produced through the same process with the types of conduction being reversed.

Embodiment 6

A MOSFET is produced in which the channel of the upper layer and the channel of the lower layer can be driven simultaneously by a single gate 1, in accordance with the process of the embodiment 4 but eliminating the ion implantation 11 shown in FIG. 4A, selecting the type of conduction of the deposited silicon film 9 to be the same as that of the substrate 7, selecting those ions that form the same type of conduction to form the source and drain, and eliminating the step for isolating the source regions 12 and 2 of the upper and lower layers. Compared with the conventional MOSFET, this means that the channel width is doubled without increasing the stray capacitance between the source and the drain, exhibiting twice as great transconductance $g_m$.

Embodiment 7

This embodiment is to produce a MOSFET of the new structure described earlier in accordance with the present invention.

Figure 5A:
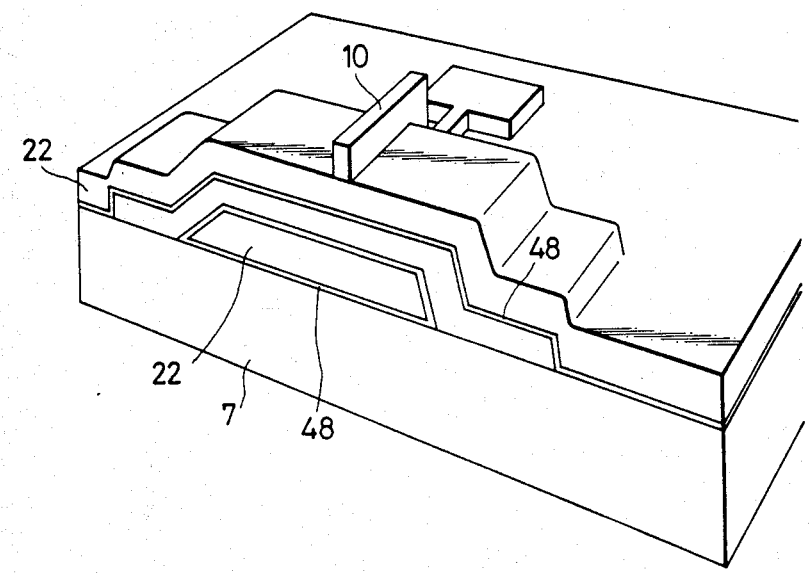
FIGS. 5A to 5F are perspective views and section views illustrating the steps according to a seventh embodiment of the present invention.
Figure 5B:
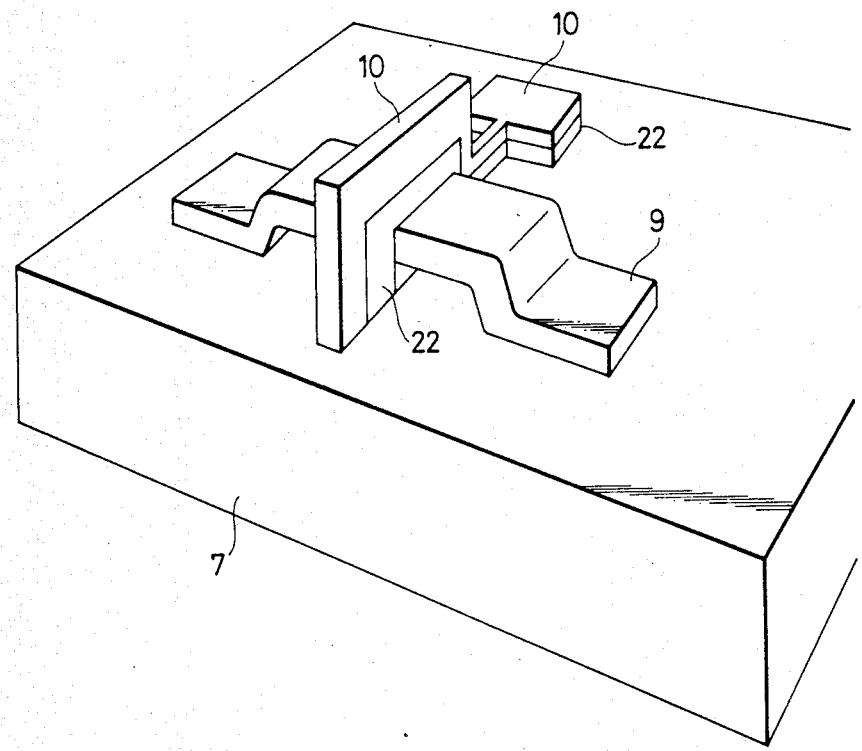
Figure 5C:
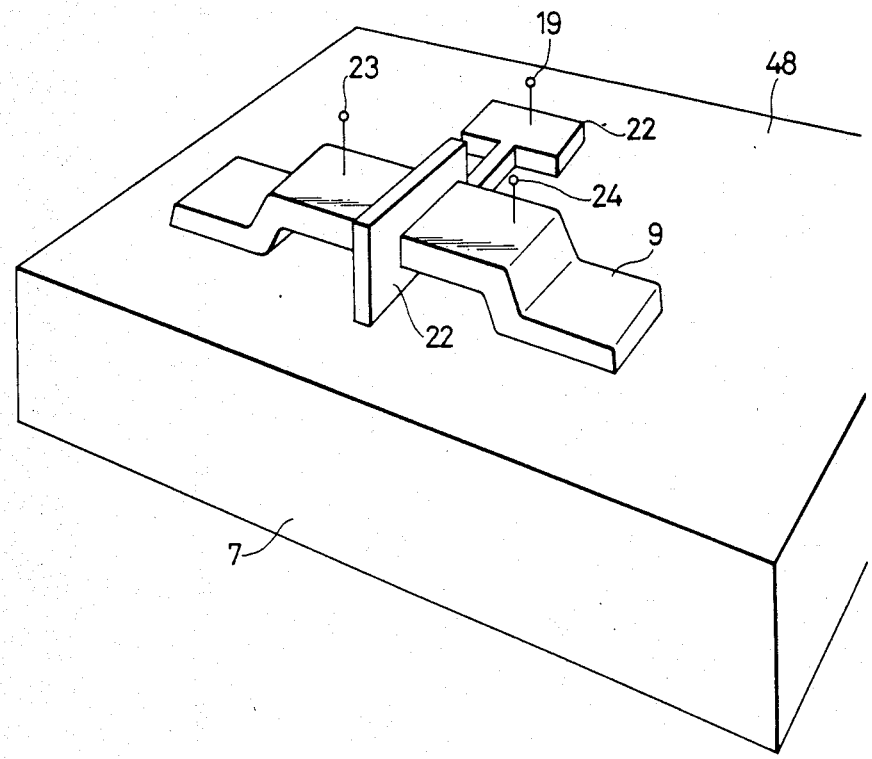
Figure 5D:
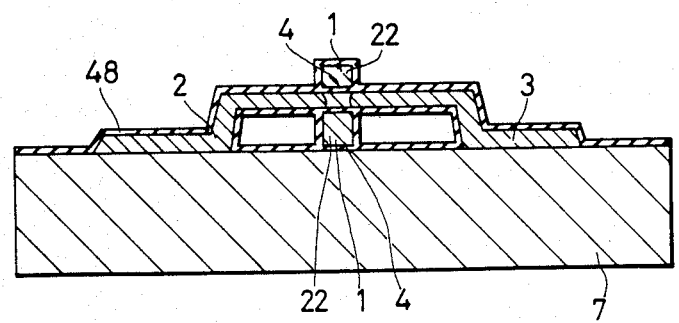
Figure 5E:
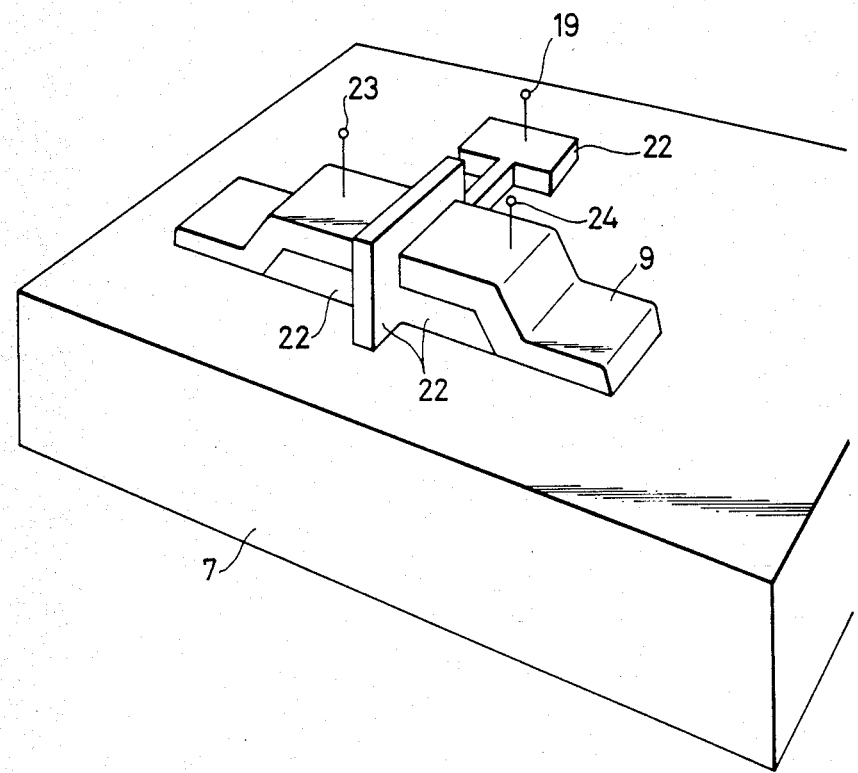
Figure 5F:
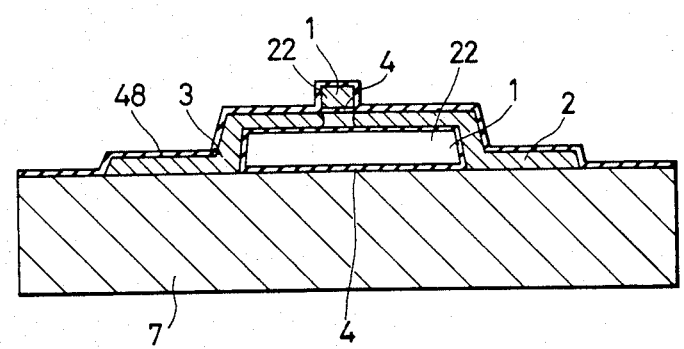

The structure shown in FIG. 1C is formed by the same procedure as the one illustrated in the embodiment 1, the conduction type of the deposited silicon film 9 is rendered to be the same as the conduction type of the substrate 7 by implanting ions, and the surface is covered with an oxide film 48 of a thickness of 250 Angstroms by thermal oxidation. Then, a polycrystalline silicon film 22 of a high impurity concentration is deposited by the CVD method, and a photomask 10 is formed thereon as shown in FIG. 5A. Through the anisotropic etching, the polycrystalline silicon film 22 is allowed to remain only under the mask 10 and under the microbridge. The polycrystalline silicon film 22 is then removed except a portion concealed by the mask 10 as shown in FIG. 5B by the anisotropic etching utilizing the sheath potential that was used for forming the dummy gate in the embodiment 4. The mask 10 is then removed, an oxide film 48 is formed maintaining a thickness of 500 Angstroms on the silicon surface by the thermal oxidation as shown in FIGS. 5C and 5D, and ions are implanted with the polycrystalline silicon film 22 as a mask, in order to form a source 2 and a drain 3 in the microbridge. When the stray capacitance between the source 2 or the drain 3 and the gate electrode 1 does not become much of a problem, the ordinary isotropic etching may be employed instead of the etching that utilizes the sheath potential. In this case, the polycrystalline silicon film 22 remains entirely under the microbridge, and the device is 10 formed as shown in FIGS. 5E and 5F. Though thermal oxidation was employed in this embodiment, it is also allowable to use the plasma oxidation, magnet-active microwave-discharged plasma CVD or the like in its place.

In FIGS. 5A to 5F, reference numeral 4 denotes a gate insulating film, 9 denotes a single crystalline silicon film, 19 denotes a gate electrode terminal, 23 denotes a source electrode terminal, and 24 denotes a drain electrode terminal.

Embodiment 8

Figure 6:
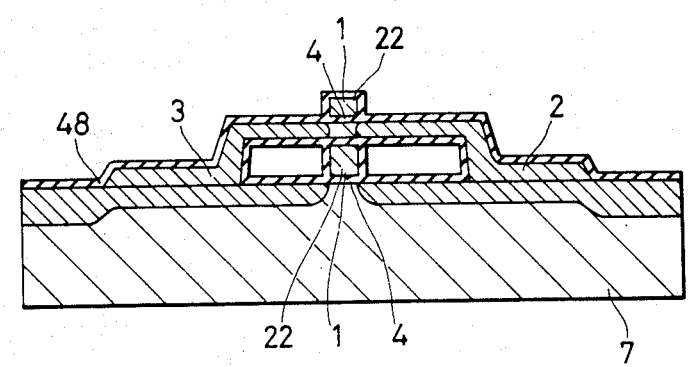
FIG. 6 is a section view illustrating a semiconductor device according to an eighth embodiment of the present invention.

In the step of the embodiment 7, a step is introduced to implant ions of the same conduction type as that of the source 2 and drain 3 of the microbridge with such a high acceleration energy that they reach the substrate 7, prior to implanting the ions that form the source 2 and drain 3 in the microbridge, in order to form a MOSFET of the structure shown in FIG. 6. The thus constructed device of this embodiment exhibits a transconductance $g_m$ which is increased by more than three times.

In FIG. 6, reference numerals denote the same portions as those of FIGS. 5A to 5F.

Embodiment 9

In the step of the embodiment 7, a step is introduced to implant ions that make the conduction type of the deposited silicon film 9 opposite to the conduction type of the substrate 7, instead of the step in which ions are implanted to make the conduction type of the deposited silicon film 9 the same as that of the substrate 7, a step is introduced to implant ions of the conduction type opposite to the conduction type of the source 12 and drain 13 in the microbridge with such a high acceleration energy that they reach the substrate 7 prior to implanting the ions that form the source 12 and drain 13 in the microbridge. A step is introduced to remove part of the source region 12 of the deposited silicon film 9 by etching using a mask in order to isolate the source region 12 from the source 2 formed in the substrate 7, after the sources 2, 12 and drains 3, 13 have been formed, to thereby obtain MOSFETs in the form shown in FIG. 7. This is a one-gate-wide CMOS inverter in which the MOSFET of the upper layer is the one that was explained in the embodiment 7.

Figure 7:
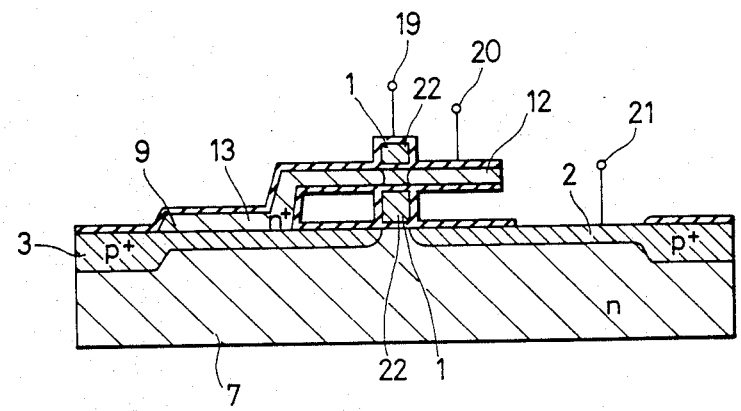
FIG. 7 is a section view illustrating a semiconductor device according to a ninth embodiment of the present invention.
Figure 8A:
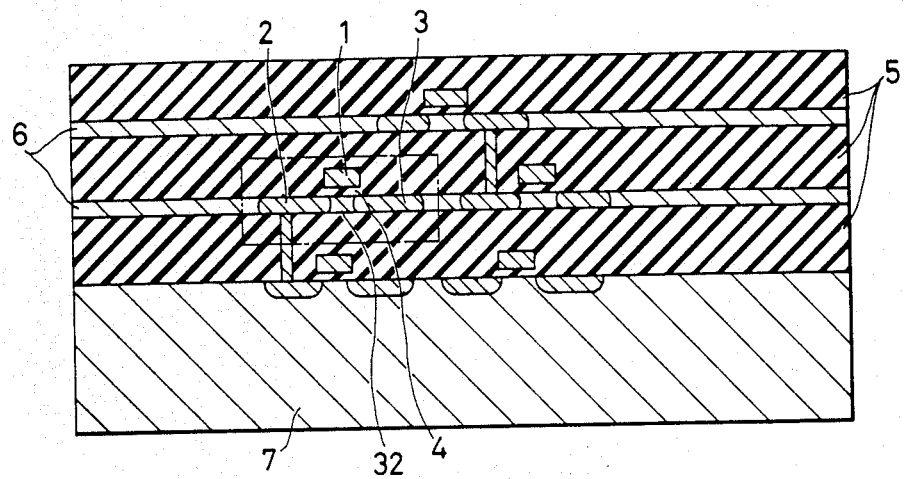
FIG. 8A is a section view illustrating a conventional multilayered integrated circuit.
Figure 8B:
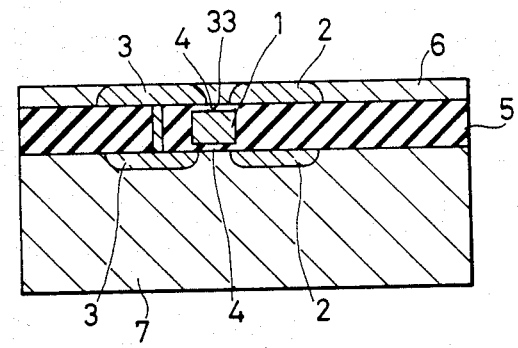
FIG. 8B is a sectional view showing a conventional one-gate-wide CMOS inverter.
Figure 9:
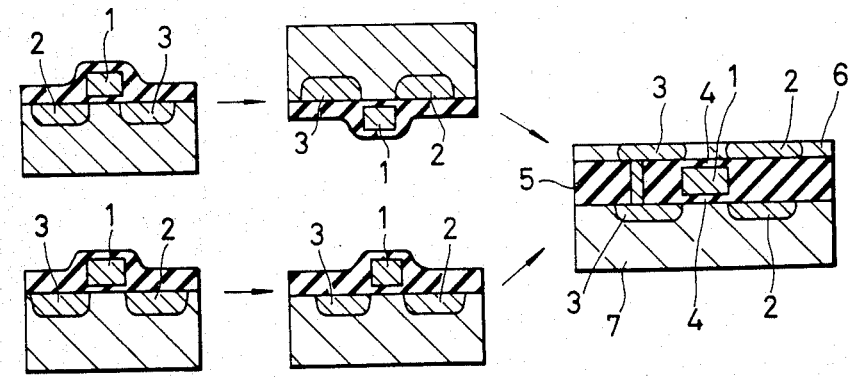
FIG. 9 is a diagram to schematically illustrate the one-gate-wide CMOS inverter.

In FIG. 7, reference numeral 1 denotes a gate electrode, 19 denotes a gate electrode terminal, 20 denotes a source electrode terminal of the MOSFET of the upper layer, 21 denotes a source electrode terminal of the MOSFET of the lower layer, and 22 denotes a polycrystalline silicon film.

In the foregoing were explained several embodiments. Among them, the air layer was used as an intermediate insulation between the MOSFET of the upper layer and the MOSFET of the lower layer or the substrate 7 in the embodiment 1 (FIG. 1D), embodiment 2 (FIG. 2D), embodiment 7 (FIG. 5D), embodiment 8 (FIG. 6) and embodiment 9 (FIG. 7). However, it needs not be pointed out that other insulator such as $SiO_2$, $Si_3N_4$ or the like may be charged into the air gap. Here, the dielectric constant of the intermediate insulator should be as small as possible. Therefore, vacuum having the smallest dielectric constant is most desired, and nitrogen or air having a small dielectric constant is desired in the next place. In the aforementioned embodiments, the elements that are obtained are mounted being filled with dry nitrogen.

In the aforementioned embodiments, furthermore, devices of the two-layered structure consisting of the deposited silicon layer and the silicon substrate, or of the three-layered structure, were obtained. However, it is also allowable to produce devices having four or more layers by further superimposing microbridges in several stages thereon in accordance with the procedure explained in the aforementioned embodiments. In the embodiment 2 and in the device of the multistage structure, furthermore, elements other than MOSFETs, such as capacitors may be formed in the microbridge or in the substrate.

In the aforementioned embodiments, furthermore, the density of surface states between the insulator and the silicon film on the insulator can be decreased to as small as about $2 \times 10^{-10}$ cm$^{-2}$. Accordingly, the leakage current between the source and the drain of the MOSFET formed in the silicon film can be decreased to be equal to, or smaller than, that of the MOSFET formed on the silicon substrate, without the need of forming the channel stopper in the interface. Widely known etching techniques may be employed to effect a variety of etchings in the above-mentioned embodiments.

According to the present invention as described above, the interface properties can be markedly improved between the underlying insulating film and the semiconductor layer formed on the insulating layer. This makes it possible to prevent the flow of leakage current between the source and the drain of the MOSFET without the need of forming a channel stopper in the interface, and to establish a fundamental process for producing a MOSFET in which the underlying insulating film serves as a gate insulating film. According to the present invention, furthermore, there is no need of forming a channel stopper as described above, eliminating the step for forming the channel stopper, and making it possible to easily obtain a one-gate-wide CMOS inverter and MOSFETs with a large transconductance.

What is claimed is:

1. A process for manufacturing semiconductor devices comprising:
   (i) a step for forming at least one first insulating film of a predetermined shape on a substrate;
   (ii) a step for forming a continuous semiconductor film on said substrate and said first insulating film;
   (iii) a step for forming at least one island region of a predetermined shape by a lithography, said island region being comprised of the continuous semiconductor film on said substrate and on said first insulating film and said first insulating film under said semiconductor film;
   (iv) a step for forming a microbridge which consists of said semiconductor film by removing said first insulating film of said island region from at least the side of said semiconductor film; and
   (v) a step for forming a second insulating film on the exposed surface of said microbridge.

2. A process for manufacturing semiconductor devices according to claim 1, wherein a step (vi) is added to form, in said microbridge, a MOSFET with said second insulating film as a gate insulating film, after said step (v).

3. A process for manufacturing semiconductor devices according to claim 2, wherein said substrate is a semiconductor substrate.

4. A process for manufacturing semiconductor devices according to claim 3, wherein said semiconductor substrate has elements formed in the surface thereof.

5. A process for manufacturing semiconductor devices according to claim 4, wherein said elements consist of MOSFETs.

6. A process for manufacturing semiconductor devices according to claim 2, wherein a step is added to provide the first insulating film on said microbridge after said step (v) has been finished, and said steps (ii) to (vi) are further repeated at least one time, in order to form a multilayered microbridge.

7. A process for manufacturing semiconductor devices according to claim 1, wherein said substrate is a semiconductor substrate.

8. A process for manufacturing semiconductor devices according to claim 7, wherein said semiconductor substrate has elements formed in the surface thereof.

9. A process for manufacturing semiconductor devices comprising:
   (i) a step for forming at least one first insulating film of a predetermined shape on a semiconductor substrate;
   (ii) a step for forming a continuous semiconductor film on said semiconductor substrate and said first insulating film;
   (iii) a step for forming at least one island region of a predetermined shape by lithography, said island region being comprised of the continuous semiconductor film on said semiconductor substrate and on said first insulating film and said first insulating film under said semiconductor film;
   (iv) a step for forming a source region and a drain region in said semiconductor substrate and in said semiconductor film, respectively, by ion implantation;
   (v) a step for forming a microbridge by removing the first insulating film from the island region, and for forming a second insulating film on the exposed surface of said microbridge; and
   (vi) a step for forming a gate electrode in a gap under said microbridge.

10. A process for manufacturing semiconductor devices according to claim 9, wherein a step (vii) is added to form a one-gate-wide CMOS inverter structure by removing a portion of the microbridge that is contacted to the source region of said semiconductor substrate, after said step (vi) has been finished.

* * * * *